United States Patent [19]

Virupaksha et al.

[11] 4,386,237

[45] May 31, 1983

[54] NIC PROCESSOR USING VARIABLE PRECISION BLOCK QUANTIZATION

[75] Inventors: Krishnamoorthy Virupaksha, Brookeville; Henri G. Suyderhoud, Potomac, both of Md.

[73] Assignee: INTELSAT, Washington, D.C.

[21] Appl. No.: 218,976

[22] Filed: Dec. 22, 1980

[51] Int. Cl.³ ............................................... G10L 1/00
[52] U.S. Cl. ................................. 179/15.55 R; 375/14
[58] Field of Search ................. 179/15.55 R, 15.55 T, 179/1 VL; 370/79, 81, 118; 375/30, 31, 28; 332/11 D

[56] References Cited

U.S. PATENT DOCUMENTS

| | | | |
|---|---|---|---|
| 3,500,247 | 3/1970 | Sekimoto et al. | 332/11 |
| 3,509,558 | 4/1970 | Cancro | 340/347 |
| 3,568,063 | 3/1971 | Brown | 325/38 |
| 3,784,922 | 1/1974 | Blahut | 329/104 |
| 3,908,181 | 9/1975 | Shigaki et al. | 340/347 AD |
| 3,931,596 | 1/1976 | Gersho et al. | 332/11 D |
| 4,005,274 | 1/1977 | Vagliani et al. | 370/118 |
| 4,051,470 | 9/1977 | Esteban et al. | 340/347 AD |
| 4,142,071 | 2/1979 | Croisier et al. | 179/15.55 R |
| 4,151,517 | 4/1979 | Kelley | 340/347 C |
| 4,216,354 | 11/1978 | Esteban et al. | 179/15.55 R |

OTHER PUBLICATIONS

Croll et al., "Nearly Instantaneous Digital Compander...", Electronics Letters, Jul. 12, 1973, pp. 298-300.

*Primary Examiner*—Emanuel S. Kemeny
*Attorney, Agent, or Firm*—Sughrue, Mion, Zinn, Macpeak and Seas

[57] ABSTRACT

A nearly instantaneous companding processor uses variable precision block quantization for reducing the digital transmission rate of speech signals while at the same time maintaining a high quality signal in a digital communication system. The variable number of bits which are used to encode each sample is controlled as a function of the maximum sample magnitude in a block of N samples. This technique takes advantage of the amplitude probability density function of a speech signal to thereby reduce the quantizing noise without increasing the transmission rate.

23 Claims, 6 Drawing Figures

NIC PROCESSOR USING VARIABLE PRECISION BLOCK QUANTIZATION

BACKGROUND OF THE INVENTION

The present invention is related to a technique for reducing the digital transmission rate of speech signals while at the same time maintaining a high quality signal in a digital communications system. More particularly, the present invention is related to a "nearly instantaneous companding" (NIC) source coding technique which uses a rescaling protocol on a block of samples to reduce the transmission bit rate. Examples of such coding techniques may be found in "Near Instantaneous Companding for Non-Uniformly Quantized PCM", by D. L. Duttweiler and D. G. Messerschmitt in *IEEE Transactions on Communications*, Vol. COM-24, No. 8, August 1976, at pages 843–864; and in "Nearly Instantaneous Companding and Time Diversity as Applied to Mobile Radio Transmission", in *International Conference on Communications*, June 1975, San Francisco, at pages 40(12)–40(15).

Figure 1:
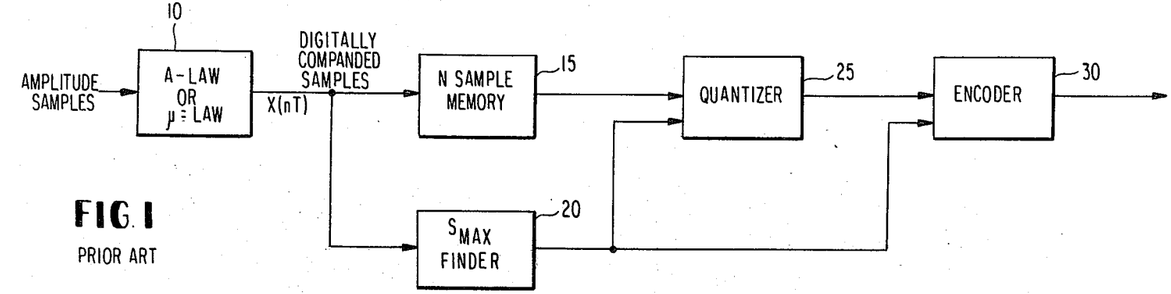
FIG. 1 is a block diagram of a prior art NIC encoder.

With reference to a prior art compander shown in FIG. 1, digital amplitude samples from a speech signal are applied to an A-law or $\mu$-law compander 10, where the digital amplitude samples are compressed according to the well known A-law or $\mu$-law data compression schemes. The digitally companded samples are applied on the one hand to an N Sample Memory 15, while on the other hand applied to Maximum Sample Finder 20. The Maximum Sample Finder 20 determines the maximum value of the N digitally companded speech samples stored in memory 15, and delivers the maximum value on the one hand to quantizer 25 and on the other hand to Encoder 30.

Generally, the purpose of the NIC processor is to reduce the transmission bit rate of the digitally companded signal x(nT), where n is equal to 0, 1, 2 ..., and T is equal to 125 $\mu$sec, for example. For convenience, the signal x(nT) will hereinafter be denoted $x_n$. The reduction in transmission bit rate is accomplished by collecting the block of N samples in memory 15, determining the largest sample magnitude, $S_{max}$, among the N samples to thereby select the quantizing range and uniformly quantizing the N samples in quantizer 25.

The quantizing step size $\Delta_i$ used in the quantizer 25 is given by $$\Delta_i = S_{max}/2^{p-1}, \qquad (1)$$

where p represents the number of bits/sample used in the transmission of the sampled information. The samples quantized in accordance with the quantizing step $\Delta_i$ are then encoded in encoder 30.

In addition to the encoded digital speech samples, m bits are needed to transmit the protocol information, namely the value $S_{max}$ or $\Delta_i$, to the receiver in order to decode that particular block of N samples. Thus, if $S_{max}$ is transmitted, the protocol information bit rate for A-law companded signals having seven bits of precision (plus one sign bit) would be 7 S/N bits per second, where S is the sampling rate. The total transmission rate is defined as the sum of the nominal rate and the protocol rate.

Thus, the overall transmission bit rate can be reduced without an overall degradation in speech quality since the quantizing or signal measuring process automatically accommodates wide variations in the value of signal amplitudes. However, this method does not take advantage of the probability of occurrences in speech signal amplitudes, since it uses the same number of quantizer levels ($2^{p-1}$), wherein the number of quantizer levels per sample block will hereinafter be referred to as the "$\mp$byte length" regardless of the value of $S_{max}$. Furthermore, the higher the value of $S_{max}$, the larger the value of $\Delta_i$. Thus, the value of $\Delta_i$ affects the quantizing noise which increases with an increasing $\Delta_i$. Again, the value of p in equation (1) cannot be varied in accordance with the above mentioned technique.

SUMMARY OF THE PRESENT INVENTION

The present invention overcomes the shortcomings associated with the prior art device by taking advantage of the amplitude probability density function of the speech signal by varying the value of p as a function of $S_{max}$.

By properly controlling the number of bits per sample, p, as a function of $S_{max}$, it is possible to reduce the quantizing noise without increasing the transmission rate. Further, the present invention uses the same number of bits, m, as in the prior device for the protocol information.

DESCRIPTION OF THE PREFERRED EMBODIMENTS

Figure 2:
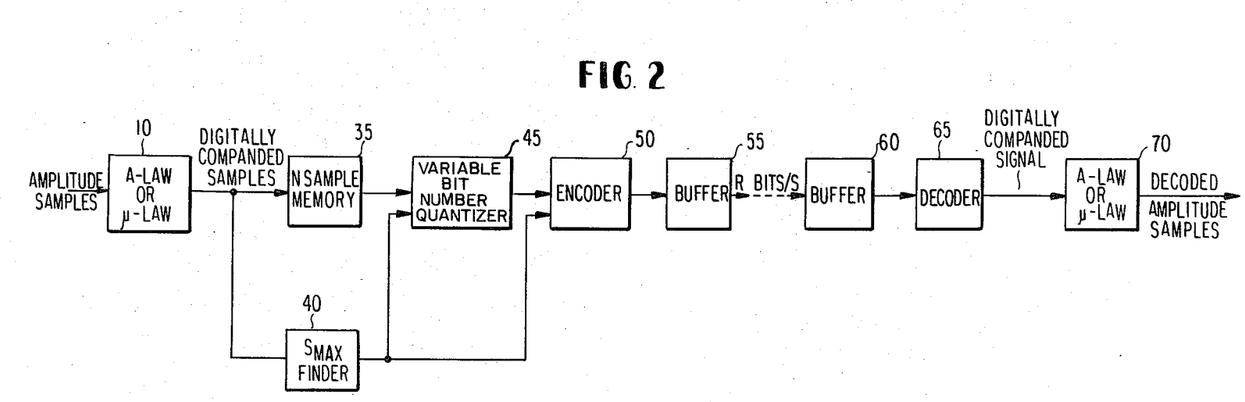
FIG. 2 is a block diagram of the NIC processor having variable precision block quantization in accordance with the present invention.

With reference to FIG. 2, the speech amplitude samples are applied to the A-law or $\mu$-law compander 10, which in turn provides digitally companded samples to N Sample Memory 35, on the one hand, and to $S_{max}$ Finder 40, on the other hand. Variable Bit Number (or Byte Length) Quantizer 45 receives a first input from memory 35 and a second input from $S_{max}$ Finder 40, and provides an output to a first input of Encoder 50, while $S_{max}$ Finder 40 provides a second input to Encoder 50. The encoded signals from Encoder 50 are applied to buffer 55, which in turn provides the transmitter with a signal having a constant bit rate of R bits/S.

On the receive end, a buffer 60 receives the constant bit rate signal and provides samples to Decoder 65 as required. Decoder 65 decodes the signal to provide a digitally companded signal to the input of an A-law or $\mu$-law compander 70. Compander 70 expands the samples to provide the reconstructed digital speech signal.

Figure 3:
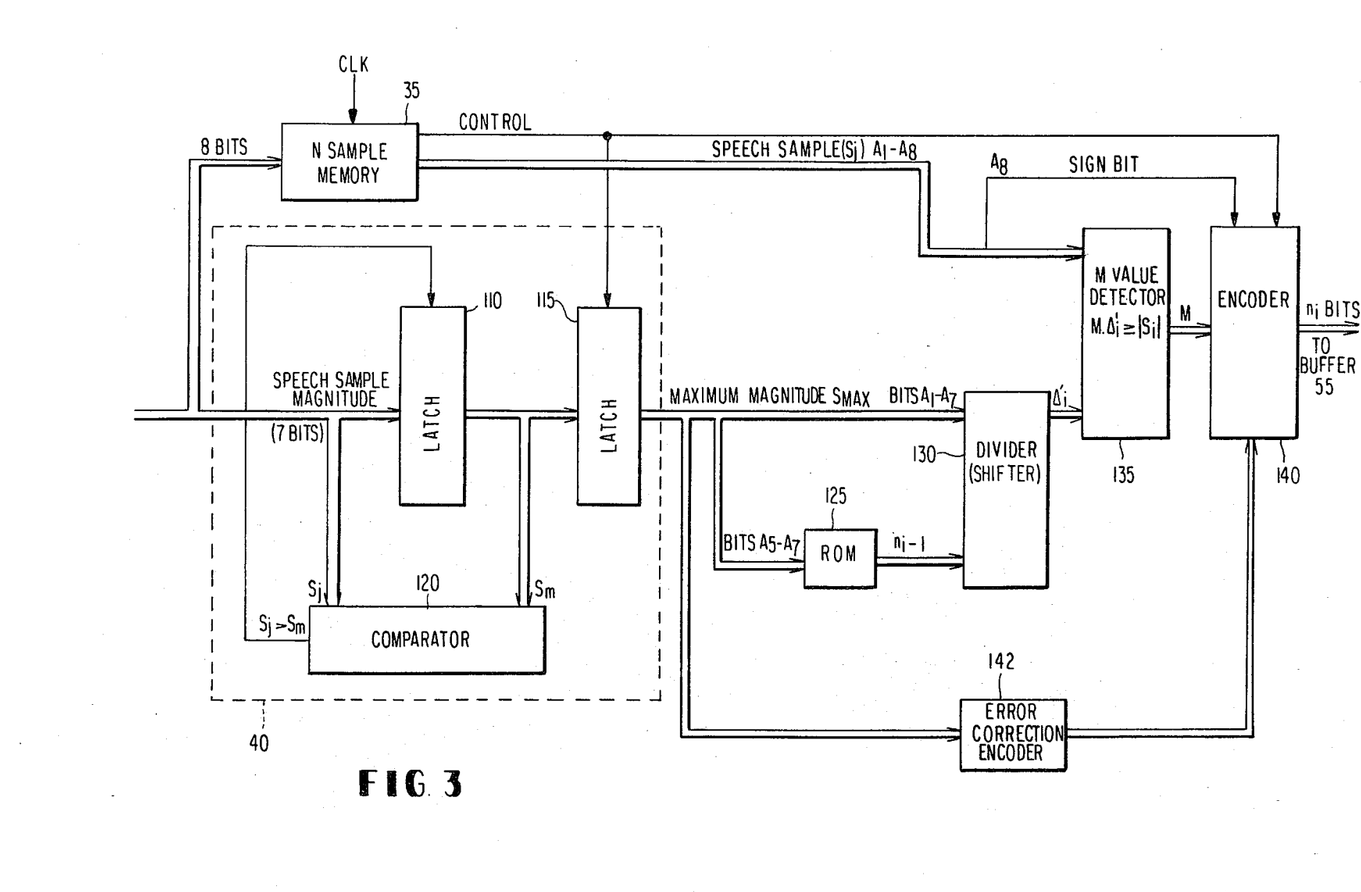
FIG. 3 is a block diagram of the details of the NIC processor in accordance with the present invention.

The NIC processor in accordance with the present invention will be described in more detail with reference to FIG. 3. Assuming A-law compression, the input to the processor is a digitally companded speech signal having 8 bit precision, 7 bits of magnitude plus one sign bit. In telephone speech transmission, these samples may typically arrive at an 8 kHz sampling rate. A "block" of N of the samples is stored in memory 35 and the maximum magnitude $S_{max}$ of the samples is determined in $S_{max}$ Finder 40. As shown in FIG. 3, the magnitude $S_j$ of each speech sample is applied to a first latch 110 and to the first input of comparator 120. The value $S_m$ stored in latch 110 will remain therein as long as its value is greater than the value of $S_j$. When such is not the case, the comparator 120 provides an enable input to latch 110 to thereby substitute the $S_j$ value for the $S_m$ value, and the process recursively continues. Latch 115 accepts the final value in latch 110 when memory 35 is filled to thereby provide the value $S_{max}$.

The value $S_{max}$ is delivered to ROM 125, divider 130 and error correction encoder 142, the latter of which provides an error correction encoded value of $S_{max}$ to encoder 140. The ROM 125 and divider 130 determine the quantizing step size $\Delta'_i$ in accordance with the equation $$\Delta'_i = S_{max}/2^{n_i-1}, \qquad (2)$$

where $n_i$ is the number of bits used to encode each sample in the ith block, the value of $n_i$ varying from one block to another depending on the value of $S_{max}$. By properly choosing the value of $n_i$ as a function $S_{max}$, the overall signal-to-quantizing noise ratio (SNR) can be considerably improved.

Table 1, below, has been found to provide a substantial improvement in the overall signal-to-quantizing noise ratio for speech signals transmitted over a telephone transmission system. With reference to FIG. 3 and Table 1, it is assumed that the A-law compander provides digitally companded signals having seven magnitude bits, A1–A7, and one sign bit A8. The three most significant magnitude bits, A5–A7, are applied to read only memory 125, the number of bits applied to ROM 125 depending upon the number of bits required to indicate all of the segments in the particular data compression scheme. For A-law companding, 8 segments are utilized, requiring a total of 3 bits to determine a segment. Thus, three bits corresponding to the segment number of the digital sample, namely bits A5 through A7, are applied to the ROM.

TABLE 1

| $S_{max}$ | A7 | A6 | A5 | A-Law Segment No. | $n_i - 1$ |
|---|---|---|---|---|---|
| | 0 | 0 | 0 | 0 | 2 |
| | 0 | 0 | 1 | 1 | 2 |
| | 0 | 1 | 0 | 2 | 2 |
| | 0 | 1 | 1 | 3 | 2 |
| | 1 | 0 | 0 | 4 | 4 |
| | 1 | 0 | 1 | 5 | 4 |
| | 1 | 1 | 0 | 6 | 6 |
| | 1 | 1 | 1 | 7 | 6 |

Read only memory 125 provides a lookup table in accordance with Table 1. Thus, for a bit pattern input for bits A7, A6 and A5 of "000", ROM 125 provides a value of $n_i - 1 = 2$, and so on.

The value of $n_i - 1$ is applied to divider 130, along with $S_{max}$ bits A1–A7, where the quantizing step level $\Delta'_i$ is determined in accordance with the equation 2. Since the quantizing level $\Delta'_i$ is equal to $S_{max}$ divided by a power of 2 ($2^2$, $2^4$ or $2^6$), the divider 130 may easily be implemented by a shift register, since a division by 2 can be achieved by a single shift of bits A1–A7. Thus, divider 130 need only accept the bit pattern A1 through A7 and shift the bit pattern a number of times equal to the value of $n_i - 1$ to provide the quantizing step size.

Figure 4:
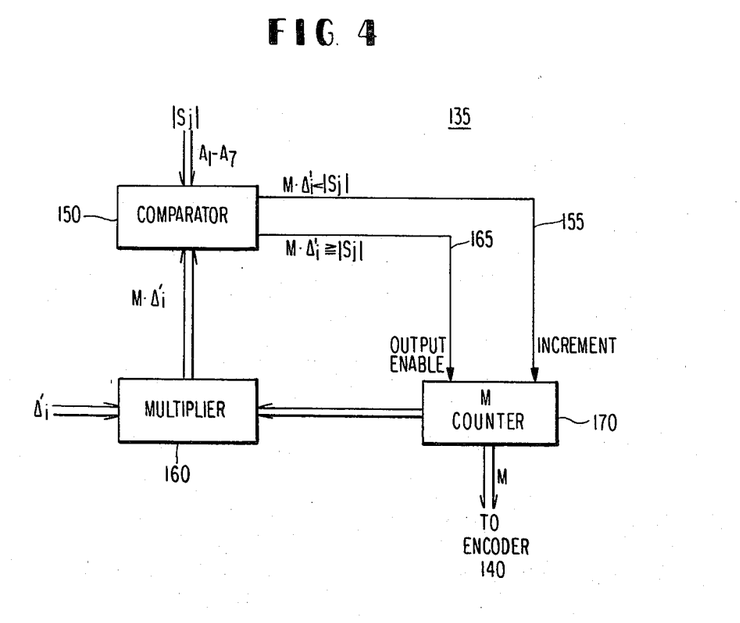
FIG. 4 is a block diagram of the details of the M Value Detector 135 of FIG. 3.

The quantizing step size $\Delta'_i$ is applied to M Value Detector 135 along with the magnitude of the companded amplitude sample $S_j$, comprising bits A1 through A7, bit A8 being applied directly from memory 35 to encoder 140. The M Value Detector 135 is illustrated in more detail in FIG. 4, and operates to determine the minimum integer M such that $M \cdot \Delta'_i$ is greater than or equal to the magnitude of $S_j$. With reference to FIG. 4, the magnitude of $S_j$ is applied to one input of comparator 150, the other input receiving the output of multiplier 160. Multiplier 160, on the other hand, receives and multiplies the quantizing step size $\Delta'_i$ and the integer M, initialized to a value of "1". The comparator provides a signal on line 155 when the value $S_j$ is greater than the value $M\Delta'_i$ to thereby increment the M Counter 170. The M Value Detector 135 thereby iterates the comparison cycle until the value $M\Delta'_i$ is greater than or equal to the magnitude of $S_j$, at which point comparator 150 provides an output on line 165 to enable M counter 170 to output the value M to encoder 140.

From an inspection of equation 2, it can be seen that at a maximum, M can only attain a value equal to $2^{n_i-1}$, the maximum M being attained when the value $S_{max}$ is applied to the M value detector. Thus, in the case where $n_i - 1$ is equal to 4, the maximum value of M is $2^4 = 16$, the quantizing step size $\Delta'_i$ providing 16 quantizing levels. Since the M counter 170 may contain a maximum count of 16, Encoder 140 encodes the value of $M - 1$ (having values 0–15) to ensure that the transmitted value can be expressed in $n_i - 1$ bits.

Figure 5:
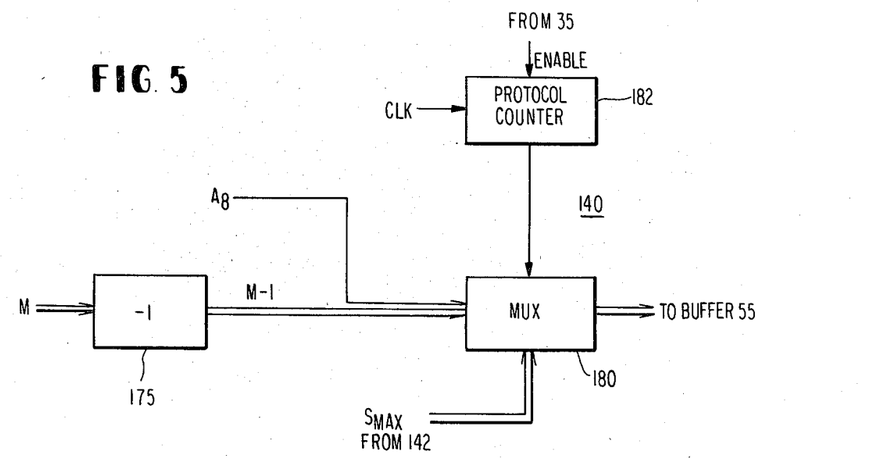
FIG. 5 is a block diagram of the details of the encoder 140 of FIG. 3.

FIG. 5 is a block diagram of the details of encoder 140. The value M is delivered from M Value Detector 135 and applied to a subtractor 175 which acts to subtract the value "1" from M. The output of subtractor 175, having a value $M - 1$, is applied to a first input of multiplexer 180, the sign bit A8 is concatenated thereto. The sequential values of $M - 1$, each of the values having $n_i$ bits including the associated sign bits, are applied to buffer 55 via multiplexer 180. Under the control of a control signal applied to the multiplexer 180, indicative of the start of a new block of N samples, the protocol information, including the error correction encoded value of $S_{max}$ is applied to the buffer 55 as the first word in each block of N samples. The N Sample Memory 35 provides the control signal to the multiplexer 180 as soon as memory 35 is filled with N samples. After a predetermined period of time associated with the generation of the protocol information, as determined by Protocol Counter 182, control is returned to the other input of multiplexer 180 to provide the values $M - 1$ to buffer 55, in a well known manner. Thereafter, the values $S_j$ are clocked out of memory 35 and applied to M Value Detector 135.

The encoded sample value can be represented as $$M - 1 = [(S_j 2^{n_i-1}) - 1]/S_{max}, \qquad (3)$$

where $S_j$ is the companded digital sample value. Since $n_i$ represents the number of bits used to encode the quantizer output, the average transmission rate R is given by $$R = s(m/N + \sum_{i=0}^{c} n_i P_i) \text{ bits/sec}, \qquad (4)$$

where s = sampling rate, m = number of bits used for protocol information, $P_i$ = the probability that $S_{max}$ falls in the ith segment of the companding law, and c = the number of segments (positive or negative) in the A-law or μ-law companding scheme.

Since the value of $n_i$ can vary from one block to another, buffer 55 is required to provide the constant output bit rate for the transmitter, as illustrated in FIG. 2.

Figure 6:
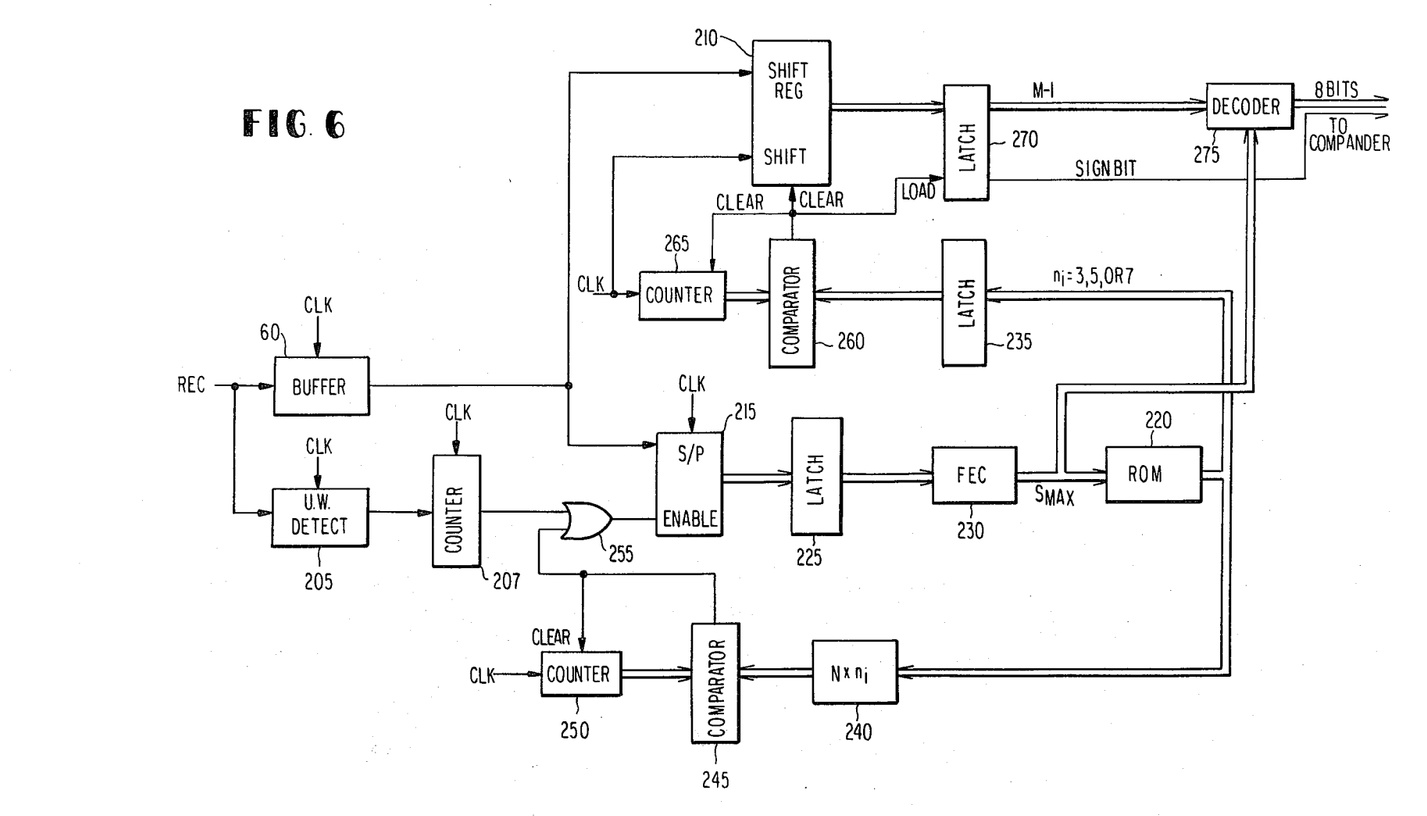
FIG. 6 is a block diagram of the details of the receiving circuitry in accordance with the present invention.

With reference to FIG. 6, the received data are applied to buffer 60 and unique word detector 205. Buffer 60 is of the first-in-first-out type and provides an output signal to shift register 210 and serial to parallel converter 215. Serial to parallel converter 215 provides a parallel input to ROM 220 via latch 225 and forward error correction circuitry 230, connected in series. FEC circuit 230 also provides an input to decoder 275. The output of ROM 220 provides an input to latch 235 and multiplier 240, the latter of which provides one input to comparator 245. The other input to comparator 245 is received from counter 250, which receives a clock signal and a clear pulse from the comparator. The output of the comparator provides an enable pulse to the serial parallel converter 215 via OR gate 225, which receives a second input from unique word detector 25 via counter 207.

The output of latch 235 is applied to a second comparator 260, the second input of which receives a signal from counter 265 controlled by the data clock. The output of comparator 260 provides a CLEAR pulse to shift register 210 and a LOAD pulse to latch 270. Latch 270 provides the signal $M-1$ to decoder 275, which in turn provides an eight bit input to A-law or μ-law compander 70, FIG. 2.

In operation, the received signal is applied to first-in-first-out buffer 60. Since the length of each block of N samples varies in accordance with the value of $n_i$, special circuitry is required for extracting the protocol information from the data stream. Assuming that initialization has not yet occurred, such as when initially receiving a burst of information, synchronization is provided in a unique word detector 205, which operates in a well known manner to extract synchronization information from an incoming data burst. After a predetermined period of time as determined in counter 207, the decoding circuitry of FIG. 6 knows a priori that protocol information is about to be received from the first block of N samples. The counter 207 thus provides an enable signal to serial to parallel converter 215 via OR gate 255. The buffered data, corresponding to the protocol information is applied to serial to parallel converter 215 and loaded into latch 225. Since the protocol information includes the bit length information for each block of N samples, special care must be taken to ensure the proper reception of the protocol information. Thus, the value of $S_{max}$, especially the three most significant bits thereof, are applied to error correction encoder 142, FIG. 3, and are accordingly decoded in forward error correction circuitry 230 to provide the value $S_{max}$ to read only memory 220.

Read only memory receives the value $S_{max}$ and produces the output $n_i$ in accordance with Table 2 below.

TABLE 2

| $S_{max}$ | A7 | A6 | A5 | $n_i$ |
|---|---|---|---|---|
| | 0 | 0 | 0 | 3 |
| | 0 | 0 | 1 | 3 |
| | 0 | 1 | 0 | 3 |
| | 0 | 1 | 1 | 3 |
| | 1 | 0 | 0 | 5 |
| | 1 | 0 | 1 | 5 |

TABLE 2-continued

| $S_{max}$ | A7 | A6 | A5 | $n_i$ |
|---|---|---|---|---|
| | 1 | 1 | 0 | 7 |
| | 1 | 1 | 1 | 7 |

ROM 220 thus provides a value of $n_i$ equal to 3, 5 or 7 to latch 235 and multiplexer 240. The value of $n_i$ applied to latch 235 is compared to the present count of counter 265 in comparator 260. Shift register 210 receives the serial output of buffer 60 and shifts the bits in accordance with the local bit rate clock to provide a parallel output to latch 270. After 3, 5 or 7 shifts in register 210, in accordance with the present value of $n_i$, comparator 260 provides a LOAD pulse to latch 270 and a CLEAR pulse to shift register 210 and counter 265 in order to provide an $n_i$ bit value of $M-1$ at the output of latch 270. Decoder 275 receives this value and decodes the value according to $$S_j = [2(M-1)+1]S_{max}/2^{n_i} \tag{5}$$

Thus, decoder can comprise any number of well known calculating devices.

The sign bit from the latch 270 is concatenated to the output of the decoder to provide 8 bit words representing samples $S_j$ to the compander 70, FIG. 2.

After the block of N samples have been delivered from buffer 60, the protocol information heading the next block of N samples must be extracted in a likewise manner. The end of the present block of N samples is detected in comparator 245. The value $N \times n_i$ is produced in multiplier 240, which receives the value $n_i$ from ROM 220, and multiplies the value by N to provide comparator 245 with the number of bits included in the N sample block. The number of bits in the block are applied to counter 250, and upon attaining a count equal to the value provided by multiplier 240, comparator 245 provides an ENABLE pulse to serial to parallel converter 215 via OR gate 255, such that the protocol information for the next block of N samples is loaded into converter 215. The ENABLE output from comparator 245 clears counter 250.

The operation of the NIC variable precision block quantizer in accordance with the present invention will be further described in the following example. Assume that $S_{max}$ finder 40, FIG. 3, determines that the maximum sample, $S_{max}$, in a block of N samples, has the bit pattern "1010111", the left most bit corresponding to A7, the most significant magnitude bit, the right most bit, A1, corresponding to the least significant bit. The three bits "101", corresponding to bits A7, A6, A5, are applied to ROM 125 where they are decoded according to Table 1. ROM 125 therefore provides the value "4" to divider 130, which operates to shift the input bit pattern A1-A7 four places to effect a division by $2^4$ or 16. Thus, shifter 130 provides the value "101.0111" to M Value Detector 135 as the value of $\Delta'_i$. Since $N_i-1$ is equal to 4, M can attain values of from 1 to 16 ($2^4$). The 4 bit value of $M-1$ for each speech sample $S_j$ has sign bit A8 added thereto for delivery from encoder 140 to buffer 55 for transmission.

Now assume that a particular speech sample $S_j$ has a value falling somewhere between 8/16 and 9/16($S_{max}$). Counter 170, FIG. 4, will output a value of M=9 since this is the minimum value which will enable the output of counter 170. Encoder 140 receives the value 9, subtracts 1, encodes the signal 8 (1000), and concatenates the sign bit thereto for transmission.

At the receive end, the decoded signal is produced in accordance with equation 5. In accordance with equation 5 in the present example, the encoded value "8" (M−1) is multiplied by 2, and 1 is added to the result to yield 17. The value 17 is scaled by the value of $S_{max}$ and divided by the value $2^{n_i}$, the value of which is 32. Thus, the decoded value for the above example is 17/32 or 8.5/16($S_{max}$), which places the decoded value approximately at the original value which was slightly higher than ½ the value of $S_{max}$.

It can readily be seen that the NIC variable precision block quantizer in accordance with the present invention can readily be modified to accommodate a variety of operational characteristics. The choice of the value $n_i-1$ as a function of $S_{max}$ can be chosen for any number of input signals and transmission media characteristics. Further, the number of bits employed to determine the value $n_i-1$ can vary according to the particular companding scheme employed. For A-law companded digital speech transmission at a transmission rate of 32 kbit/second, the processor in accordance with the present invention provides a 5 to 7 db improvement in signal-to-quantizing noise ratio compared to the existing NIC technique illustrated in FIG. 1.

The present invention thus produces a reduced rate of transmission without sacrificing speech quality and can be used in a single channel or digital speech interpolation environment. Further, the present invention is designed to directly receive a companded PCM input, and can be fully implemented using standard digital elements. The digital elements can be discrete, or a number of the elements in accordance with the present invention may be embodied in a single microprocessor.

Various changes, additions, and omissions of elements may be made within the scope and spirit of this invention. It is to be understood that the invention is not limited to specific details, examples and preferred embodiments shown and described herein.

What is claimed is:

1. An apparatus for encoding a block of N digital samples having sign and magnitude bits, being of the type wherein each of said N samples are quantized in a quantizer and the quantizer output is then encoded for transmission, said apparatus comprising:
   maximum value finding means for finding the maximum value of said N samples;
   bit number determining means for determining, as a function of said maximum value, the number of bits to be used in encoding said N samples;
   step size determining means for determining, as a function of said maximum value, a quantizing step size for said N samples;
   quantizing means for quantizing said samples in accordance with said step size to obtain quantized values; and
   means for encoding said quantized values to produce N encoded samples each encoded with a number of bits determined by said bit number determining means.

2. The apparatus of claim 1 wherein each of said N samples are represented by a plurality of bits in a data compressed format having a predetermined number of segments, and wherein said bit number determining means examines a group of bits from said maximum value, the number of bits in said group being the minimum number of bits which can be used to uniquely identify each of said segments.

3. The apparatus of claim 2 wherein said bit number determining means comprises a memory device receiving said group of bits from said maximum value for determining said bit number in accordance with said group of bits.

4. The apparatus of claim 3 wherein said group of bits consists of three bits, and said bit number is one of 2, 4 and 6 bits, excluding said sign bits.

5. The apparatus of claim 4 wherein said group of bits are taken from the most significant magnitude bits in said maximum value, and said memory device provides the input/output function:

| Group of Bits | Bit Number Excluding Sign Bit |
| --- | --- |
| 0 0 0 | 2 |
| 0 0 1 | 2 |
| 0 1 0 | 2 |
| 0 1 1 | 2 |
| 1 0 0 | 4 |
| 1 0 1 | 4 |
| 1 1 0 | 6 |
| 1 1 1 | 6. |

6. The apparatus of any one of claims 1–5 wherein said step size determining means determines said quantizing step size as a function of said bit number as determined by said bit number determining means.

7. The apparatus of claim 6 wherein said step size determining means comprises a divider for dividing said maximum value by a power of 2 to produce said quantizing step size.

8. The apparatus of claim 7 wherein said power of 2 is equal to $$2^{n_i-1},$$

where $n_i-1$ represents said bit number excluding said sign bits.

9. An apparatus for decoding a plurality of blocks of data, each block having N digital samples, each of said samples having a number of bits which is variable from block to block but is the same for all samples in any given block, each of said blocks of data including protocol information indicative of the value of the largest of said N samples, said apparatus comprising:
   protocol extracting means for extracting said protocol information from said blocks of data;
   sample forming means for forming said N digital samples in accordance with said value of the largest of said N samples represented by said protocol information; and
   decoder means for decoding said N digital samples in accordance with said protocol information to provide decoded values.

10. The apparatus of claim 9 comprising sample length determining means responsive to said extracted protocol information to provide sample length information to said sample forming means indicating the number of bits in each sample in accordance with said value of said largest of said N samples.

11. The apparatus of claim 10 wherein said decoder decodes each of said N digital samples as a function of (i) the value of each of said N samples, (ii) said value of the largest of said N samples, and (iii) the value of said number of bits in each sample.

12. The apparatus of claim 11 wherein said decoder decodes said N digital samples in accordance with the function:

$$S_j = [2(M-1)+1]S_{max}/2^{n_i},$$

where $S_j$ = the decoded value, $M-1$ = the value of the associated digital sample produced by said sample forming means, $S_{max}$ = the value of said largest of said N samples, and $n_i$ = the length in bits of said associated digital sample.

13. A process for encoding a block of N digital samples having sign and magnitude bits, the process comprising:
   finding the maximum value of said N samples;
   determining the number of bits to be used in encoding said N samples as a function of said maximum value;
   determining a quantizing step size for said N samples as a function of said maximum value;
   quantizing said samples according to said determined quantizing step size to obtain quantized values; and
   encoding said quantized values to produce N encoded samples each having said determined number of bits.

14. The method of claim 13 wherein said N digital samples are each represented by a plurality of bits in a compressed format having a predetermined number of segments, said step of determining said number of bits comprising examining a group of bits from said maximum value, the number of bits being examined corresponding to the minimum number of bits which can be used to uniquely identify each of said segments.

15. The method of claim 14 wherein said number of examined bits is three bits and said step of determining said number of bits further comprises selecting the number of said bits to be used in encoding said samples to be equal to one of 2, 4 and 6 bits, excluding sign bits.

16. The method of claim 15 wherein said selecting step comprises selecting the bit number excluding said sign bit as a function of the value of said group of bits as follows:

| Group of Bits | Bit Number Excluding Sign Bit |
| --- | --- |
| 0 0 0 | 2 |
| 0 0 1 | 2 |
| 0 1 0 | 2 |
| 0 1 1 | 2 |
| 1 0 0 | 4 |
| 1 0 1 | 4 |
| 1 1 0 | 6 |

-continued

| Group of Bits | Bit Number Excluding Sign Bit |
| --- | --- |
| 1 1 1 | 6 |

17. The method of any one of claims 14, 15 or 16, wherein said step of determining said quantizing step size comprises determining said quantizing step size as a function of said determined bit number.

18. The method of claim 17, wherein said step of determining said quantizing step size comprises dividing said maximum value by a power of 2 to produce said quantizing step size.

19. The method of claim 18 wherein said power of 2 is equal to $$2^{n_i-1},$$

where $n_i-1$ represents said determined bit number excluding sign bits.

20. A method for decoding a plurality of blocks of data, each block having N digital samples, each of said samples having a number of bits which is variable from block to block but is the same for all samples in any given block, each of said blocks of data including protocol information indicative of the value of the largest of said N samples, said method comprising:
   extracting said protocol information from said blocks of data;
   forming said N digital samples in accordance with said value of said largest of said N samples indicated by said protocol information; and
   decoding said N digital samples in accordance with said protocol information to provide decoded values.

21. The method of claim 20 wherein said forming step includes the step of determining the number of bits in said samples in response to said extracted protocol information, and forming said N digital samples in accordance with said determined number of bits.

22. The method of claim 21 wherein said decoding step comprises decoding each of said N digital samples as a function of (i) the value of said each sample, (ii) the value of the largest of said N samples, and (iii) the value of said determined number of bits.

23. The method of claim 22 wherein said decoding step comprises decoding each of said N digital samples in accordance with the function $$S_j = [2(M-1)+1]S_{max}/2^{n_i},$$

where $S_j$ = the decoded value, $M-1$ = the value of said each digital sample, $S_{max}$ = the value of said largest of said N samples, and $n_i$ = said determined number of bits.

* * * * *

UNITED STATES PATENT AND TRADEMARK OFFICE
CERTIFICATE OF CORRECTION

PATENT NO. : 4,386,237

DATED : May 31, 1983

INVENTOR(S) : Krishnamoorthy Virupaksha et al

It is certified that error appears in the above-identified patent and that said Letters Patent is hereby corrected as shown below:

Column 2, line 6, "÷" should be --"--.

Column 5, line 22, "225" should be --255--.

Column 5, line 23, "25" should be --205--.

Signed and Sealed this

Twelfth Day of June 1984

[SEAL]

Attest:

GERALD J. MOSSINGHOFF

Attesting Officer     Commissioner of Patents and Trademarks